(12) United States Patent
Hsieh et al.

(10) Patent No.: US 12,068,345 B2
(45) Date of Patent: Aug. 20, 2024

(54) IMAGE SENSOR PACKAGE HAVING A LIGHT BLOCKING MEMBER

(71) Applicant: SEMICONDUCTOR COMPONENTS INDUSTRIES, LLC, Phoenix, AZ (US)

(72) Inventors: Yu-Te Hsieh, Taoyuan (TW); I-Lin Chu, New Taipei (TW)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 67 days.

(21) Appl. No.: 17/816,797

(22) Filed: Aug. 2, 2022

(65) Prior Publication Data
US 2023/0025520 A1   Jan. 26, 2023

Related U.S. Application Data

(63) Continuation of application No. 16/506,497, filed on Jul. 9, 2019, now Pat. No. 11,444,111.

(60) Provisional application No. 62/825,529, filed on Mar. 28, 2019.

(51) Int. Cl.
*H01L 27/146* (2006.01)
*H01L 31/0203* (2014.01)

(52) U.S. Cl.
CPC .. *H01L 27/14618* (2013.01); *H01L 27/14683* (2013.01); *H01L 31/0203* (2013.01)

(58) Field of Classification Search
CPC ......... H01L 27/14618; H01L 27/14683; H01L 31/0203; H01L 27/1462–14623; H01L 27/14625–14629
See application file for complete search history.

(56) References Cited

U.S. PATENT DOCUMENTS

| | | | |
|---|---|---|---|
| 5,981,048 A | 11/1999 | Sugimoto et al. | |
| 7,576,401 B1* | 8/2009 | de Guzman | G02B 7/021 |
| | | | 257/E31.127 |
| 8,653,612 B2 | 2/2014 | Okada et al. | |
| 9,034,729 B2 | 5/2015 | Yamada et al. | |
| 10,388,684 B2 | 8/2019 | Kinsman et al. | |
| 10,510,787 B2 | 12/2019 | Borthakur et al. | |
| 10,868,061 B2 | 12/2020 | Wu | |
| 2007/0090478 A1 | 4/2007 | Chen et al. | |
| 2009/0166784 A1 | 7/2009 | Honda | |
| 2010/0060757 A1 | 3/2010 | Takasaki et al. | |
| 2011/0102547 A1* | 5/2011 | Sul | H01L 31/02162 |
| | | | 257/E31.127 |
| 2011/0156187 A1 | 6/2011 | Tu et al. | |
| 2011/0156188 A1* | 6/2011 | Tu | H01L 27/14623 |
| | | | 257/E31.127 |

(Continued)

*Primary Examiner* — Steven B Gauthier
*Assistant Examiner* — Khatib A Rahman
(74) *Attorney, Agent, or Firm* — Brake Hughes Bellermann LLP

(57) ABSTRACT

According to an aspect, an image sensor package includes a substrate, an image sensor die coupled to the substrate, and a transparent member including a first surface and a second surface, where the second surface of the transparent member is coupled to the image sensor die via one or more dam members such that an empty space exists between an active area of the image sensor die and the second surface of the transparent member. The image sensor package includes a light blocking member coupled to or defined by the transparent member.

19 Claims, 10 Drawing Sheets

(56) References Cited

U.S. PATENT DOCUMENTS

| | | | |
|---|---|---|---|
| 2012/0211852 A1 | 8/2012 | Iwafuchi et al. | |
| 2013/0203895 A1 | 8/2013 | Dershem | |
| 2014/0225172 A1* | 8/2014 | Chiang | H01L 27/1462 |
| | | | 257/292 |
| 2014/0267760 A1 | 9/2014 | Lee et al. | |
| 2014/0353639 A1* | 12/2014 | Sakamoto | H10K 50/844 |
| | | | 438/33 |
| 2015/0116591 A1* | 4/2015 | Han | H04N 23/54 |
| | | | 348/374 |
| 2015/0215505 A1 | 7/2015 | Lu et al. | |
| 2016/0104735 A1* | 4/2016 | Li | H01L 27/1462 |
| | | | 359/359 |
| 2016/0190204 A1* | 6/2016 | Chiu | H01L 24/97 |
| | | | 438/64 |
| 2017/0012069 A1* | 1/2017 | Rudmann | H01L 24/48 |
| 2017/0345862 A1 | 11/2017 | Kinsman et al. | |
| 2017/0345864 A1 | 11/2017 | Kinsman et al. | |
| 2018/0359437 A1 | 12/2018 | Watanabe | |
| 2019/0043904 A1 | 2/2019 | Chien et al. | |
| 2019/0074310 A1 | 3/2019 | Chuang et al. | |
| 2019/0367694 A1* | 12/2019 | Enomoto | G01N 21/41 |

* cited by examiner

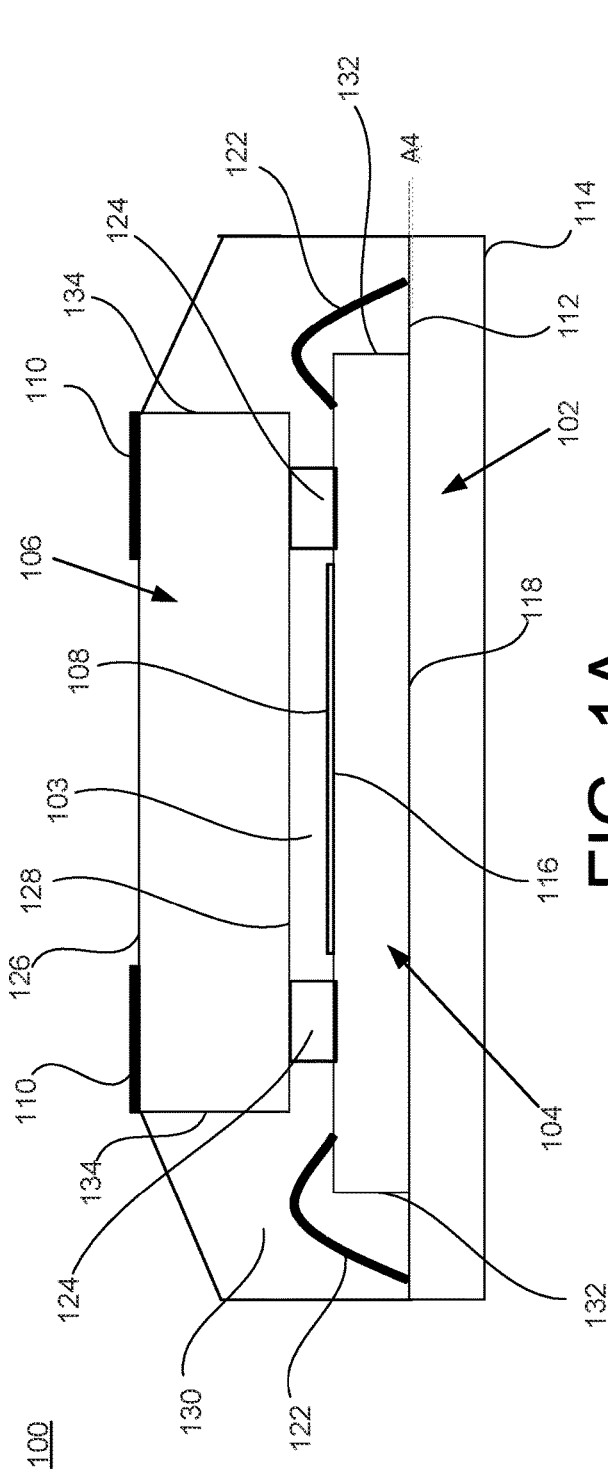
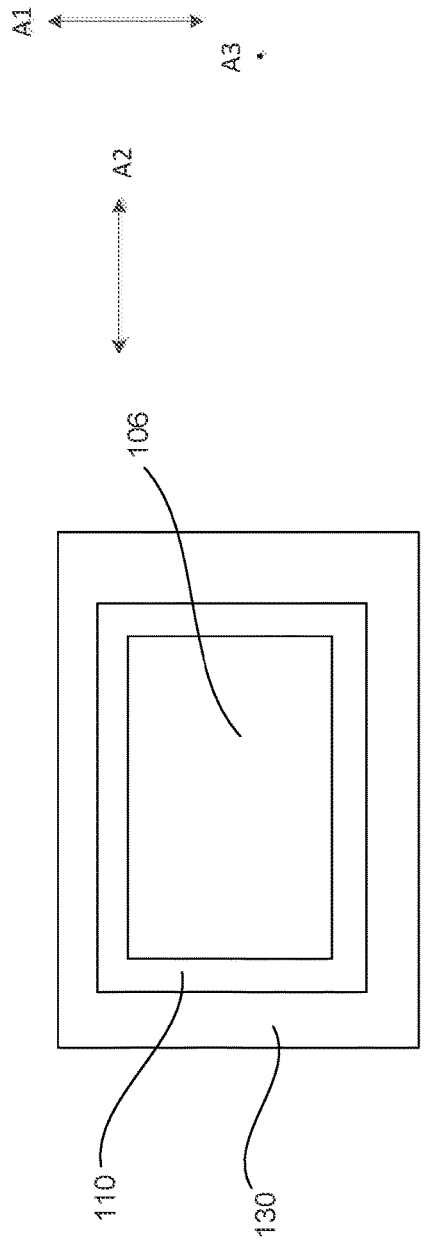
FIG. 1A
FIG. 1B

IMAGE SENSOR PACKAGE HAVING A LIGHT BLOCKING MEMBER

CROSS-REFERENCE TO RELATED APPLICATION

This application is a continuation of, and claims priority to, U.S. non-provisional application Ser. No. 16/506,497, filed on Jul. 9, 2019, which claims priority to U.S. provisional application No. 62/825,529, filed on Mar. 28, 2019, the entire content of each application is incorporated by reference herein in its entirety.

TECHNICAL FIELD

This description relates to an image sensor package having a light blocking member.

BACKGROUND

Flare by light reflection within an image sensor package may introduce noise into the image captured by the image senor die. In some examples, an image sensor package may be susceptible to electrostatic discharge (ESD) charging, which may cause damage to the image sensor die and/or cause one or more defects in the captured image.

SUMMARY

According to an aspect, an image sensor package includes a substrate, an image sensor die coupled to the substrate, a transparent member including a first surface and a second surface, where the second surface of the transparent member is coupled to the sensor die via one or more dam members such that an empty space exists between an active area of the image sensor die and the second surface of the transparent member. The image sensor package includes a light blocking member coupled to or defined by the transparent member.

According to various aspects, the image sensor package may include one or more of the following features (or any combination thereof). The light blocking member may include a non-transparent material configured to block light. The light blocking member may include an anti-electrostatic discharge material. The light blocking member may include a non-transparent layer coupled to the first surface of the transparent member. The light blocking member may include a non-transparent layer coupled to the second surface of the transparent member. The light blocking member may include a non-transparent dam member coupled to the second surface of the transparent member. The light blocking member may include one or more roughened areas of at least one of the first surface or the second surface of the transparent member. The light blocking member may include a non-transparent adhesive layer coupled to the second surface of the transparent member, where the non-transparent adhesive layer has a portion disposed between a dam member and the second surface of the transparent member. The sensor package may include one or more bond wires connected to the substrate and the image sensor die, and an encapsulation material that encapsulates the bond wires. The light blocking member may extend to the encapsulation material.

According to an aspect, an image sensor package includes a substrate, an image sensor die coupled to the substrate, and a transparent member having a first surface and a second surface, where the second surface of the transparent member is coupled to the sensor die via one or more dam members such that an empty space exists between an active area of the image sensor die and the second surface of the transparent member. The image sensor package includes one or more bond wires connected to the substrate and the image sensor die, an encapsulation material that encapsulates the bond wires, and a light blocking member coupled to at least one of the first surface of the transparent member or the second surface of the transparent member.

According to various aspects, the image sensor package may include any one or more of the above/below features (or any combination thereof). The light blocking member may include a non-transparent layer coated or printed on a perimeter area of the first surface. The light blocking member may include a non-transparent dam member coupled to the second surface of the transparent member. The light blocking member may include a polymer resin with electrically conductive material embedded into the polymer resin. The light blocking member may extend to the encapsulation material. The encapsulation material may include a molding compound. The encapsulation material may be formed from a liquid encapsulate. The image sensor die may include a complementary metal-oxide-semiconductor (CMOS) image sensor (CIS).

According to an aspect, a method for forming an image sensor package includes attaching an image sensor die to a substrate, coupling one or more bonding wires to the image sensor die and the substrate, and attaching a glass cover to the image sensor die, where a portion of a surface of the glass cover is coupled to a non-transparent layer, and the non-transparent layer reduces or blocks light that would otherwise cause flare within the image sensor package. In some examples, the method includes coating the non-transparent layer to the portion of the surface of the glass cover, where the coating step is performed before or after the attaching step.

The details of one or more implementations are set forth in the accompanying drawings and the description below. Other features will be apparent from the description and drawings, and from the claims.

BRIEF DESCRIPTION OF THE DRAWINGS

FIG. 1A illustrates an image sensor package according to an aspect.

FIG. 1B illustrates a top view of the image sensor package according to an aspect.

DETAILED DESCRIPTION

Figure 2:
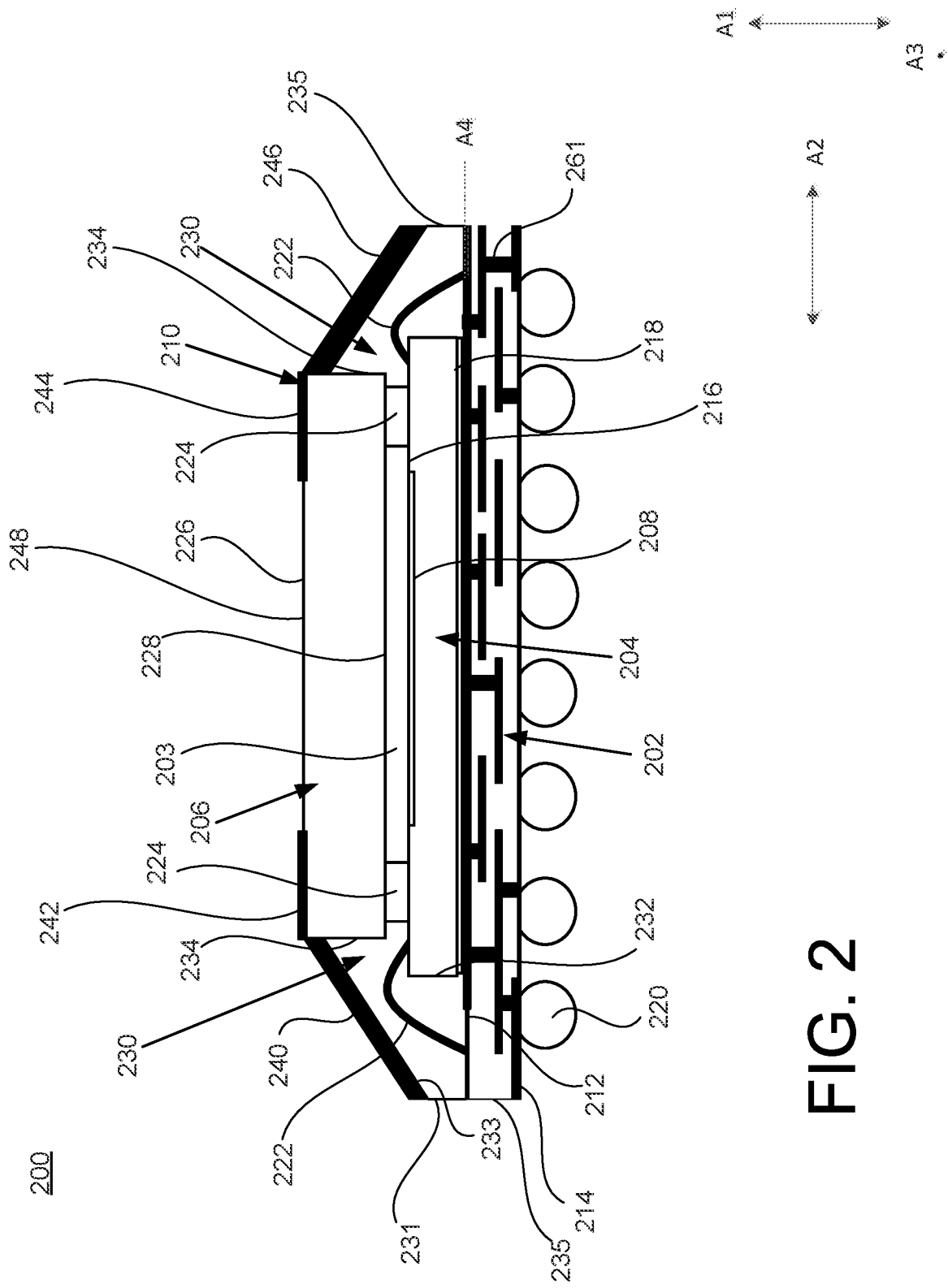
FIGS. 2-6 illustrates an image sensor package according to another aspect.

The present disclosure relates to an image sensor package having a light block member that is coupled to or defined by a transparent member (e.g., a glass substrate), where the transparent member is coupled to an image sensor die. In some examples, the light block member is a light block coating that is applied on the perimeter area (e.g., an area that is around or aligned along a perimeter; an area that defines a perimeter (e.g., an enclosed perimeter, a partially enclosed perimeter)) of the top surface of the transparent member, and/or the bottom surface of the transparent member. In some examples, the light blocking member is a non-transparent layer that is coated or printed on a portion of the top surface (or the bottom surface, or both the top and bottom surfaces) of the transparent member, and may extend to the encapsulation material. In some examples, the encapsulation material is formed from a liquid encapsulate and/or molding compound.

In some examples, the light blocking member is a non-transparent dam member (e.g., adhesive layer) that is coupled to the bottom surface of the transparent member between an edge of the transparent member and the pixel area. In some examples, the light blocking member is a textured area defined on one or more portions of the top surface of the transparent member and/or one or more portions of the bottom surface of the transparent member.

The light blocking member may reduce (or eliminate) the flare within the image sensor package, thereby reducing the amount of noise (e.g., one or more artifacts) introduced into the image captured by the image sensor die, and the light blocking member may reduce (or eliminate) ESD charging, thereby reducing (or eliminating) potential damage to the image sensor die and/or reducing (or preventing) deflects in the captured image.

FIG. 1A illustrates an image sensor package 100 according to an aspect, and FIG. 1B illustrate a top view of the image sensor package 100 according to an aspect. In some examples, the image sensor package 100 includes a complementary metal-oxide-semiconductor (CMOS) image sensor (CIS) package. The image sensor package 100 includes a substrate 102, an image sensor die 104 coupled to the substrate 102, and a transparent member 106 coupled to the image sensor die 104 such that an empty space 103 exists (e.g., is defined) between an active area 108 of the image sensor die 104 and the transparent member 106.

The image sensor package 100 includes a light blocking member 110 coupled to at least a portion of the transparent member 106. In some examples, as shown in FIG. 1A, the light blocking member 110 is coupled to a first surface 126 of the transparent member 106. In some examples, the light blocking member 110 is coupled to a second surface 128 of the transparent member 106. In some examples, the light blocking member 110 is coupled to both the first surface 126 and the second surface 128. In some examples, the light blocking member 110 extends along a perimeter area of the first surface 126 (e.g., as shown in FIG. 1B) and/or the second surface 128. In some examples, the light block member 110 extends to portions of an encapsulation material 130.

In some examples, the light blocking member 110 includes a nontransparent coating such as a polymer resin having non-transparent properties. In some examples, the light blocking member 110 includes one or more electrostatic discharge (ESD) materials. In some examples, the light blocking member 110 includes a polymer resin with an electrically conductive material. In some examples, the electrically conductive material is embedded within the polymer resin. In some examples, the electrically conductive material includes nickel (Ni), chromium (Cr), aluminum (Al), and/or copper (Cu).

In some examples, the light blocking member 110 includes one or more non-transparent dam members. In some examples, the non-transparent dam members include a light blocking adhesive material. In some examples, the non-transparent dam members may be formed (e.g., created) with a solder mask material by lithography patterning on the second surface 128 (and/or the first surface 126). In some examples, the solder mask may be a dry film or liquid type photosensitive PI or epoxy adhesive, which may be patterned by a lithography process. In some examples, the light blocking member 110 includes one or more roughened areas defined on portions of the first surface 126 and/or the second surface 128. In some examples, the roughened areas are formed by sandblasting, laser, and/or chemical etching. In some examples, the light blocking member 110 includes a light blocking adhesive layer coupled to the first surface 126 and/or the second surface 128. In some examples, the light blocking adhesive layer may include a fully cured adhesive material.

In some examples, the light blocking member 110 may reduce (or eliminate) the flare within the image sensor package 100, thereby reducing the amount of noise introduced into the image captured by the image sensor die 104. In some examples, the light blocking member 110 may reduce (or eliminate) ESD charging, thereby reducing (or eliminating) potential damage to the image sensor die 104 and/or reducing (or preventing) deflects in the captured image.

The substrate 102 includes a printed circuit board (PCB) substrate. In some examples, the substrate 102 includes a dielectric material. In some examples, the substrate 102 includes a single layer of PCB base material. In some examples, the substrate 102 includes multiple layers of PCB base material. The substrate 102 includes a first surface 112 and a second surface 114 that is disposed opposite to the first surface 112. In some examples, the substrate 102 includes one or more conductive layer portions (e.g., electrical traces) disposed on the first surface 112 of the substrate 102, and/or one or more conductive layer portions (e.g., electrical traces) disposed on the second surface 114 of the substrate 102. In some examples, the electrical traces may be configured to and/or used to transmit signals to and/or from devices (e.g., electronic devices included in a semiconductor region (e.g., epitaxial layer and/or semiconductor substrate)) connected to the electrical traces. In some examples, the electrical traces can include conductive traces (e.g., metallic traces) such as copper traces, aluminum traces, and/or so forth.

The first surface 112 of the substrate 102 is disposed in a plane A4. In some examples, the second surface 114 is disposed in parallel with the first surface 112. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The image sensor die 104 may include a complementary metal-oxide semiconductor (CMOS) image sensor. The image sensor die 104 includes a first surface 116 and a second surface 118 disposed opposite to the first surface 116. In some examples, the first surface 116 (and/or the second surface 118) is parallel to the first surface 112 (and/or the second surface 114). The image sensor die 104 defines the active area 108 on the first surface 116 of the image sensor die 104. The active area 108 may have or correspond with, an array of pixel elements configured to convert electromagnetic radiation (e.g., light) to electrical signals.

The image sensor die 104 is coupled to the substrate 102. For example, the second surface 118 of the image sensor die 104 may be coupled to the first surface 112 of the substrate 102 using one or more bonding materials (e.g., an adhesive layer, die attach film, polymer-based material, an epoxy resin, etc.) in order to physically couple the image sensor die 104 to the substrate 102. In some examples, one or more bond wires 122 are connected to the image sensor die 104 and the substrate 102 in order to communicatively couple the image sensor die 104 to the substrate 102. The bond wires 122 may include conductive (e.g., metal) wires such as aluminum, copper, or gold, or any combination thereof, for example. In some examples, the image sensor die 104 is coupled to the substrate 102 in a flip-chip configuration. In some examples, the image sensor die 104 is coupled to the substrate 102 by surface mount technology (SMT) (e.g., interconnection by solder joint). In some examples, the image sensor die 104 is coupled to the first surface 112 of the substrate 102 using one or more bump members (e.g., copper pillars with solder, gold plated bumps, solder bumps, and/or gold stud bumps, etc.). In some examples, an under-fill material is disposed the gap between the image sensor die 104 and the substrate 102, where the under-fill material encapsulates the bump members.

The transparent member 106 is coupled to the image sensor die 104 such that the transparent member 106 is positioned over (and spaced apart from) the active area 108 on the first surface 116 of the image sensor die 104 in the direction A1. In some examples, the first surface 126 (and/or the second surface 128) is parallel to the first surface 116 (and/or the second surface 118). In some examples, the image sensor package 100 includes dam members 124 that position the transparent member 106 away from the active area 108 on the first surface 116 of the image sensor die 104. For example, the dam members 124 are coupled to the second surface 128 of the transparent member 106 and to the first surface 116 of the image sensor die 104, where the active area 108 on the first surface 116 of the image sensor die 104 is disposed between adjacent dam members 124. In some examples, the dam members 124 include an adhesive material. In some examples, the dam members 124 include an epoxy resin. In some examples, the dam members 124 include a polymer-based material.

The transparent member 106 includes an optically transparent material that allows electromagnetic radiation (e.g., light (e.g., visible light)) to pass through (e.g., pass through the entirety of the material). In some examples, the transparent member 106 includes an optically transparent material that allows the transmission of light waves without being scattered (or being scattered to a relatively small or negligible degree). In some examples, the transparent member 106 includes a cover. In some examples, the transparent member 106 includes a lid. In some examples, the transparent member 106 includes one or more organic materials and/or one or more inorganic materials. In some examples, the transparent member 106 includes a glass material. In some examples, the transparent member 106 includes one or more layers of transparent material.

The image sensor package 100 includes an encapsulation material 130 configured to encapsulate one or more components of the image sensor package 100. In some examples, the encapsulation material 130 is formed from a liquid encapsulation. In some examples, the encapsulation material 130 includes a molding material. The encapsulation material 130 includes one or more types of material (e.g., in a molding compound if including multiple types of materials) such as a metal, a plastic, a resin, an epoxy, a phenolic hardener, a silica material, a pigment, a glass, a ceramic casing, and/or so forth. The encapsulation material 130 may encapsulate the bond wires 122. The encapsulation material 130 may be disposed on the first surface 112 of the substrate 102 at locations adjacent to the image sensor die 104. The encapsulation material 130 may extend along an edge 132 of the image sensor die 104, the dam members 124, and/or an edge 134 of the transparent member 106.

FIG. 2 illustrates an image sensor package 200 according to an aspect. In some examples, the image sensor package 200 includes a complementary metal-oxide-semiconductor (CMOS) image sensor (CIS) package. The image sensor package 200 may include any of the features described with respect to the image sensor package 100 of FIGS. 1A and 1B. The image sensor package 200 includes a substrate 202, an image sensor die 204 coupled to the substrate 202, and a transparent member 206 coupled to the image sensor die 204 such that an empty space 203 exists between an active area 208 of the image sensor die 204 and the transparent member 206.

The image sensor package 200 includes a non-transparent layer 210 coupled to at least a portion of the transparent member 206. In some examples, the nontransparent layer 210 is coupled to a perimeter area of the transparent member 206. In some example, the non-transparent layer 210 is a light block coating that extends around a perimeter area of the transparent member 206. In some examples, the non-transparent layer 210 extends to an encapsulation material 230 of the image sensor package 200. In some examples, the non-transparent layer 210 extends around a perimeter area of the encapsulation material 230. In some examples, the non-transparent layer 210 includes one or more electrostatic discharge (ESD) materials. In some examples, the non-transparent layer 210 includes a polymer resin with an electrically conductive material. In some examples, the electrically conductive material is embedded within the polymer resin. In some examples, the electrically conductive material includes nickel (Ni), chromium (Cr), aluminum (Al), and/or copper (Cu).

In some examples, the non-transparent layer 210 may reduce (or eliminate) the flare within the image sensor package 200, thereby reducing the amount of noise introduced into the image captured by the image sensor die 204. In some examples, the non-transparent layer 210 may reduce (or eliminate) ESD charging, thereby reducing (or eliminating) potential damage to the image sensor die 204 and/or reducing (or preventing) deflects in the captured image.

The substrate 202 includes a printed circuit board (PCB) substrate. In some examples, the substrate 202 includes a dielectric material. In some examples, the substrate 202 includes a single layer of PCB base material. In some examples, the substrate 202 includes multiple layers of PCB base material. The substrate 202 includes a first surface 212 and a second surface 214 that is disposed opposite to the first surface 212. In some examples, the substrate 202 includes electrical traces 261. The electrical traces 261 may include one or more conductive layer portions disposed on the first surface 212 of the substrate 202, one or more conductive layer portions (e.g., electrical traces) disposed on the second surface 214 of the substrate 202, and/or one or more conductive layer portions embedded within the substrate 202.

The image sensor package 200 may include one or more conductive components 220 coupled to the second surface 214 of the substrate 202. In some examples, the conductive components 220 are surface-mount packaging elements. In some examples, the conductive components 220 include solder balls. The conductive components 220 are components used to connect to an external device (e.g., a ball grid array (BGA) device). However, the conductive components 220 may include other types of surface-mount packaging elements.

The first surface 212 of the substrate 202 is disposed in a plane A4. In some examples, the second surface 214 is disposed in parallel with the first surface 212. A direction A1 is aligned perpendicular to the plane A4, and a direction A2 is perpendicular to the direction A1. A direction A3 into the page (shown as a dot) is aligned parallel to the plane A4 and is orthogonal to directions A1 and A2. The directions A1, A2, and A3, and plane A4, are used throughout several of the various views of the implementations described throughout the figures for simplicity.

The image sensor die 204 may include a complementary metal-oxide semiconductor (CMOS) image sensor. The image sensor die 204 includes a first surface 216 and a second surface 218 disposed opposite to the first surface 216. In some examples, the first surface 216 (and/or the second surface 218) is parallel to the first surface 212 (and/or the second surface 214). The image sensor die 204 defines the active area 208 on the first surface 216 of the image sensor die 204. The active area 208 may have or correspond with, an array of pixel elements configured to convert electromagnetic radiation (e.g., light) to electrical signals.

The image sensor die 204 is coupled to the substrate 202. For example, the second surface 218 of the image sensor die 204 may be coupled to first surface 212 of the substrate 202 using one or more bonding materials (e.g., an adhesive layer, die attach film, polymer-based material, an epoxy resin, etc.) in order to physically couple the image sensor die 204 to the substrate 202. In some examples, one or more bond wires 222 are connected to the image sensor die 204 and the substrate 202 in order to communicatively couple the image sensor die 204 to the substrate 202. The bond wires 222 may include conductive (e.g., metal) wires such as aluminum, copper, or gold, or any combination thereof, for example. In some examples, the image sensor die 204 is coupled to the substrate 202 in a flip-chip configuration. In some examples, the image sensor die 204 is coupled to the substrate 202 by surface mount technology (SMT) (e.g., interconnection by solder joint). In some examples, the image sensor die 204 is coupled to the first surface 212 of the substrate 202 using one or more bump members (e.g., copper pillars with solder, gold plated bumps, solder bumps, and/or gold stud bumps, etc.). In some examples, an under-fill material is disposed the gap between the image sensor die 204 and the substrate 202, where the under-fill material encapsulates the bump members.

The transparent member 206 is coupled to the image sensor die 204 such that the transparent member 206 is positioned over (and spaced apart from) the active area 208 on the first surface 216 of the image sensor die 204 in the direction A1. The transparent member 206 includes a first surface 226 and a second surface 228 disposed opposite to the first surface 226. In some examples, the first surface 226 (and/or the second surface 228) is parallel to the first surface 216 (and/or the second surface 218). In some examples, the image sensor package 200 includes dam members 224 that position the transparent member 206 away from the active area 208 on the first surface 216 of the image sensor die 204. For example, the dam members 224 are coupled to the second surface 228 of the transparent member 206 and to the first surface 216 of the image sensor die 204, where the active area 208 on the first surface 216 of the image sensor die 204 is disposed between adjacent dam members 224. In some examples, the dam members 105 include an adhesive material. In some examples, the dam members 224 include an epoxy resin. In some examples, the dam members 224 include a polymer-based material.

The transparent member 206 includes an optically transparent material that allows electromagnetic radiation (e.g., light (e.g., visible light)) to pass through (e.g., pass through the entirety of the material). In some examples, the transparent member 206 includes a glass material.

The image sensor package 200 includes an encapsulation material 230 configured to encapsulate one or more components of the image sensor package 200. In some examples, the encapsulation material 230 is formed from a liquid encapsulation. In some examples, the encapsulation material 230 includes a molding material. The encapsulation material 230 may encapsulate the bond wires 222. The encapsulation material 230 may be disposed on the first surface 212 of the substrate 202 at locations adjacent to the image sensor die 204. The encapsulation material 230 may extend along an edge 232 of the image sensor die 204, the dam members 224, and/or an edge 234 of the transparent member 206. In some examples, the encapsulation material 230 defines a first edge 231 and a second edge 233. In some examples, the first edge 231 and the second edge 233, collectively, define an end of the encapsulation material 230.

In some examples, the first edge 231 is linear. In some examples, the first edge 231 includes one or more curved portions. In some examples, at least a portion of the first edge 231 (or all of the first edge 231) is aligned with the direction A1. In some examples, at least a portion of the first edge 231 (or all of the first edge 231) is aligned with an edge 235 of the substrate 202. In some examples, the first edge 231 is disposed at a location between the edge 235 of the substrate 202 and the edge 232 of the image sensor die 204. The second edge 233 may extend from the first edge 231 to the edge 234 of the transparent member 206. In some examples, the second edge 233 is disposed at a non-zero angle with respect to the first edge 231 such that the encapsulation material 230 is tapered. In some examples, the second edge 233 is linear. In some examples, the second edge 233 includes one or more bent or cured portions. In some examples, the first edge 231 and the second edge 233 are linear, and are disposed perpendicular to each other.

The non-transparent layer 210 may include a portion 242 that is disposed on a portion of the first surface 226 that is proximate to the edge 234 on one side of the transparent member 206, and may include a portion 244 that is disposed on another portion of the first surface 226 that is proximate to the edge 234 on the other side of the transparent member 206. In some examples, the non-transparent layer 210 extends around a perimeter area of the first surface 226 of the non-transparent layer 210 (e.g., extends all the way around or extends only over a portion of the perimeter area). The first surface 226 of the transparent member 206 includes a portion 248 that is devoid of a non-transparent layer 210.

In some examples, the portion 242 has a first length (e.g., extending along the direction A2) that starts at the edge 234 of the transparent member 206 and extends along a portion of the first surface 226 of the transparent member 206 in a first direction. In some examples, the portion 244 has a second length (e.g., extending along the direction A2) that starts at the other edge 234 of the transparent member 206 and extends along a portion of the first surface 226 of the transparent member 206 in a second direction (e.g., the second direction being opposite to the first direction). In some examples, the first length is the same as the second length. In some examples, the first length is different than the second length. In some examples, the portion 248 (e.g., the part of the first surface 226 that is devoid of the nontransparent layer 210) has a third length (e.g., extending along the direction A2). In some examples, the third length is greater than a sum of the first length and the second length.

In some examples, the non-transparent layer 210 extends along one or more portions of the encapsulation material 230 (e.g., along the second edge 233). In some examples, the non-transparent layer 210 extends around a perimeter area of the encapsulation material 230. The non-transparent layer 210 includes a portion 240 that extends from the portion 242, and along the second edge 233 on one side of the encapsulation material 230. In some examples, the non-transparent layer 210 extends along the entire length of the second edge 233. In some examples, the non-transparent layer 210 extends a portion of the length of the second edge 233. The non-transparent layer 210 includes a portion 246 that extends from the portion 244, and is disposed on the second edge 233 on the other side of the encapsulation material 230.

Figure 3:
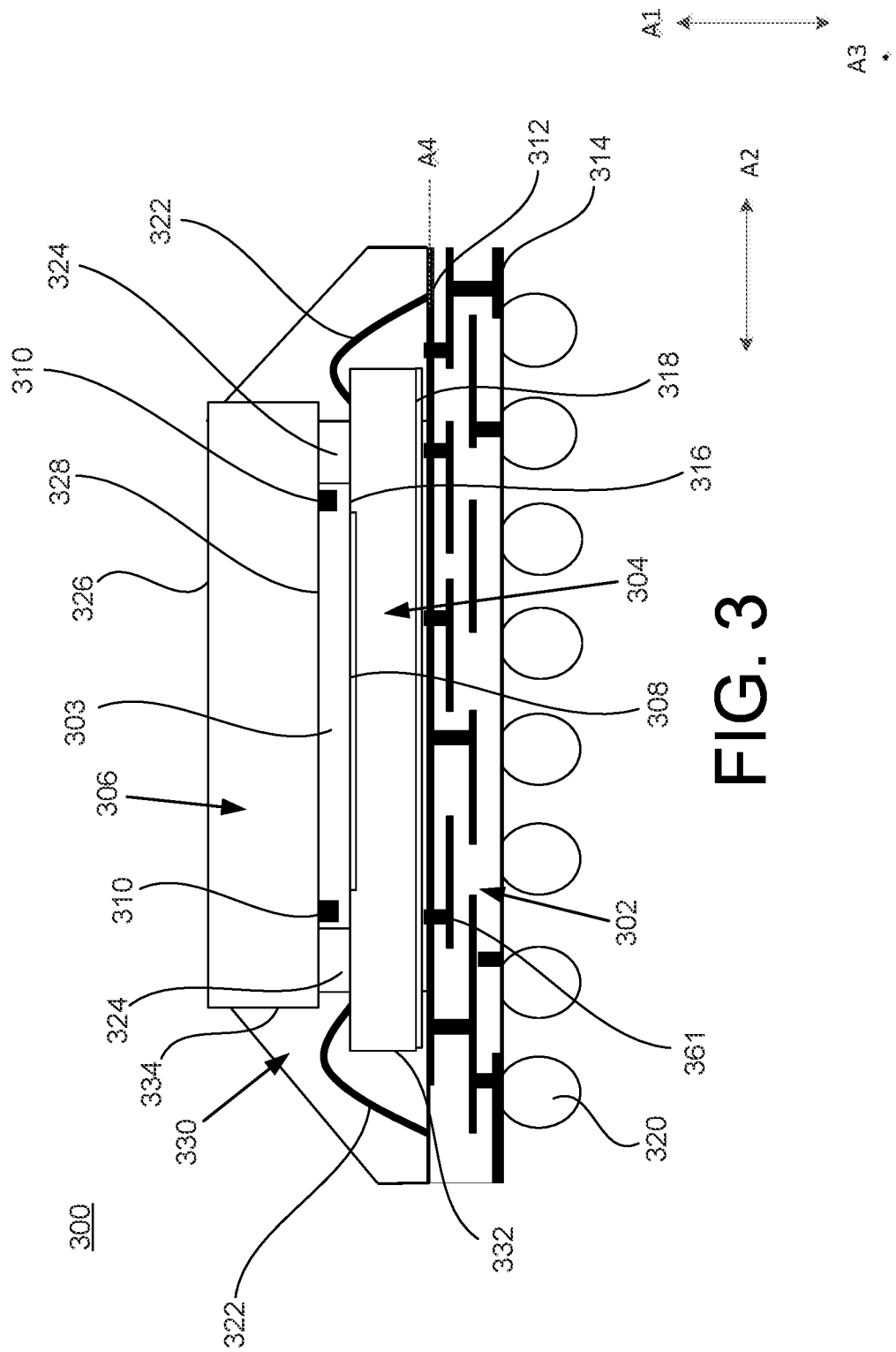

FIG. 3 illustrates an image sensor package 300 according to an aspect. The image sensor package 300 includes components similar to the image sensor package 200 of FIG. 2 except that the image sensor package 300 includes non-transparent dam members 310 coupled to a second surface 328 of a transparent member 306. The image sensor package 300 may include any of the features described with reference to the previous figures. In some examples, the non-transparent dam members 310 include an adhesive material or layer that is configured to block light. The non-transparent dam members 310 may reduce (or eliminate) the flare within the image sensor package 300, thereby reducing the amount of noise introduced into the image captured by the image sensor die 304. The non-transparent dam members 310 may reduce (or eliminate) ESD charging, thereby reducing (or eliminating) potential damage to the image sensor die 304 and/or reducing (or preventing) deflects in the captured image. The image sensor package 300 may include any of the features discussed with reference to the image sensor package 200 of FIG. 2.

The image sensor package 300 includes a substrate 302, an image sensor die 304 coupled to the substrate 302, and a transparent member 306 coupled to the image sensor die 304 such that an empty space 303 exists between an active area 308 of the image sensor die 304 and the transparent member 306.

The substrate 302 includes a printed circuit board (PCB) substrate. In some examples, the substrate 302 includes a dielectric material. The substrate 302 includes a first surface 312 and a second surface 314 that is disposed opposite to the first surface 312. In some examples, the substrate 302 includes electrical (e.g., metal) traces 361. The electrical traces 361 may include one or more conductive layer portions disposed on the first surface 312 of the substrate 302, one or more conductive layer portions disposed on the second surface 314 of the substrate 302, and/or one or more conductive layer portions embedded within the substrate 302. The first surface 312 of the substrate 302 is disposed in a plane A4.

The image sensor package 300 may include one or more conductive components 320 coupled to the second surface 314 of the substrate 302. In some examples, the conductive components 320 are surface-mount packaging elements. In some examples, the conductive components 320 include solder balls. The image sensor die 304 may include a complementary metal-oxide semiconductor (CMOS) image sensor. The image sensor die 304 includes a first surface 316 and a second surface 318 disposed opposite to the first surface 316. The image sensor die 304 defines the active area 308 on the first surface 316 of the image sensor die 304. The active area 308 may have or correspond with, an array of pixel elements configured to convert electromagnetic radiation (e.g., light) to electrical signals.

The image sensor die 304 is coupled to the substrate 302. For example, the second surface 318 of the image sensor die 304 may be coupled to the first surface 312 of the substrate 302 using one or more bonding materials (e.g., an adhesive layer, die attach film, polymer-based material, an epoxy resin, etc.) in order to physically couple the image sensor die 304 to the substrate 302.

The transparent member 306 is coupled to the image sensor die 304 such that the transparent member 306 is positioned over (and spaced apart from) the active area 308 on the first surface 316 of the image sensor die 304 in the direction A1. The transparent member 306 includes a first surface 326 and a second surface 328 disposed opposite to the first surface 326. In some examples, the image sensor package 300 includes dam members 324 that position the transparent member 306 away from the active area 308 on the first surface 316 of the image sensor die 304. For example, the dam members 324 are coupled to the second surface 328 of the transparent member 306 and to the first surface 316 of the image sensor die 304, where the active area 308 on the first surface 316 of the image sensor die 304 is disposed between adjacent dam members 324. In some examples, the dam members 324 include an adhesive material. In some examples, the dam members 324 include an epoxy resin. In some examples, the dam members 324 include a polymer-based material.

The transparent member 306 includes an optically transparent material that allows electromagnetic radiation (e.g., light (e.g., visible light)) to pass through (e.g., pass through the entirety of the material). In some examples, the transparent member 306 includes a glass material. The image sensor package 300 includes an encapsulation material 330 configured to encapsulate one or more components of the image sensor package 300. The encapsulation material 330 may encapsulate the bond wires 322. The encapsulation material 330 may be disposed on the first surface 312 of the substrate 302 at locations adjacent to the image sensor die 304. The encapsulation material 330 may extend along an edge 332 of the image sensor die 304, the dam members 324, and/or an edge 334 of the transparent member 306.

In some examples, the non-transparent dam members 310 are created with a solder mask material by lithography patterning on the second surface 328 of the transparent member 306. In some examples, the solder mask may be a dry film or liquid type photosensitive PI or epoxy adhesive, which may be patterned by a lithography process. In some examples, the non-transparent dam members 310 include multiple nontransparent dam members. A non-transparent dam member 310 includes a height that extends in the direction A1, a width that extends in the direction A2, and a length that extends in the direction A3. In some examples, the height of the non-transparent dam member 310 is less than a height of the dam member 324 (where the height of the dam member 324 extends in the direction A1). In some examples, the non-transparent dam member 310 extends between the second surface 328 of the transparent member 306 and the first surface 316 of the image sensor die 304 (e.g., the height of the non-transparent dam member 310 is equal to the height of the dam member 324).

The non-transparent dam members 310 are coupled to the second surface 328 of the transparent member 306. In some examples, the non-transparent dam members 310 are coupled to the transparent member 306 at locations adjacent to the dam members 324. In some examples, a non-transparent dam member 310 is coupled to the transparent member 306 at a location of the second surface 328 (along the direction A2) between a dam member 324 and the active area 308 of the image sensor die 304. In some examples, a small space exists between a non-transparent dam member 310 and a dam member 310. In some examples, a non-transparent dam member 310 is disposed directly adjacent to a dam member 324.

Figure 4:
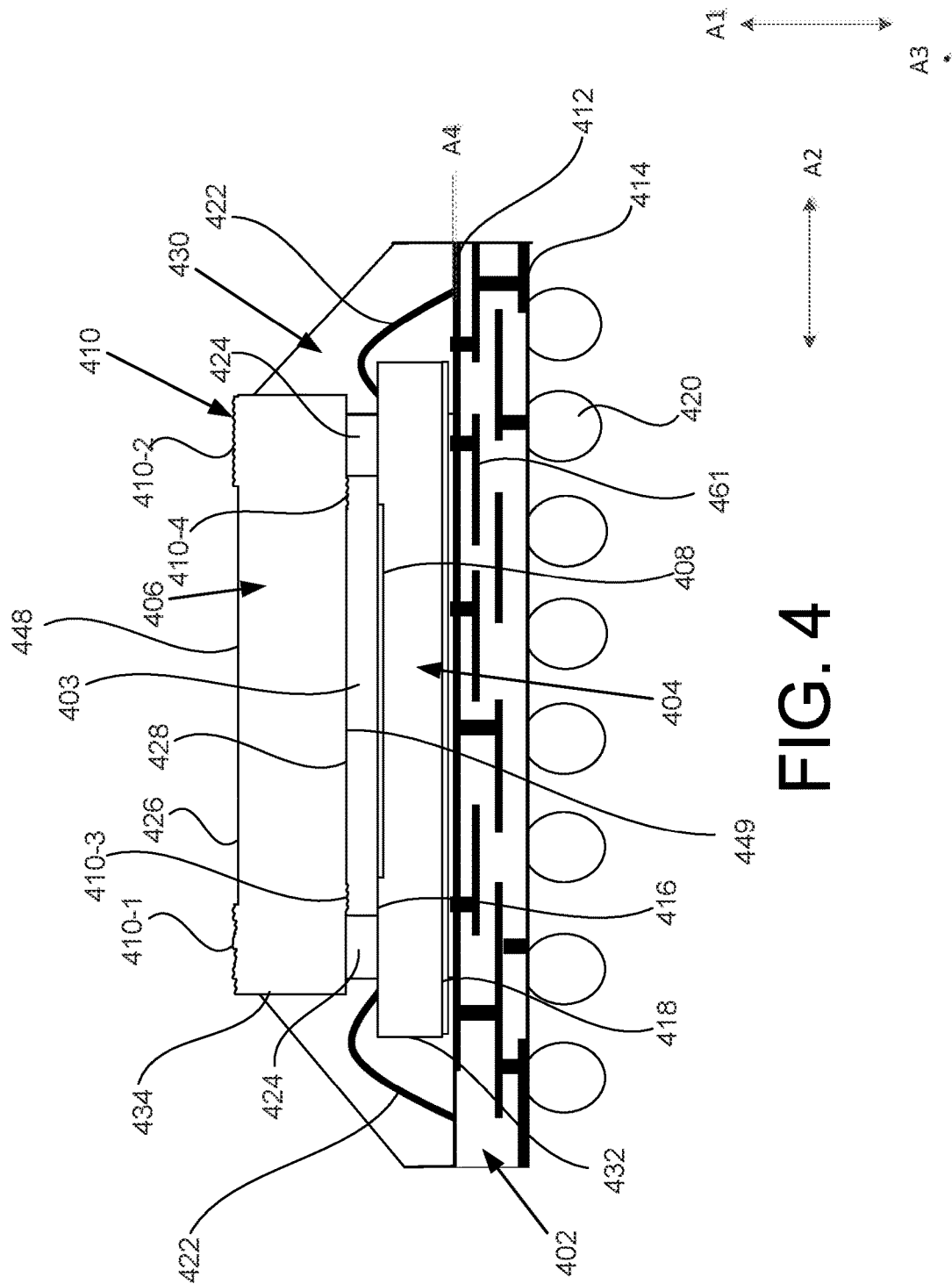

FIG. 4 illustrates an image sensor package 400 according to an aspect. The image sensor package 400 includes components similar to the image sensor package 200 of FIG. 2 and/or the image sensor package 300 of FIG. 3 except that the image sensor package 400 includes roughened areas 410 on portions of a transparent member 406 in order to reduce the flare within the image sensor package 400, thereby reducing the amount of noise introduced into the image captured by the image sensor die 404. The image sensor package 400 may include any of the features discussed with reference to the image sensor package 100 of FIGS. 1A and 1B, the image sensor package 200 of FIG. 2 and/or the image sensor package 300 of FIG. 3, and therefore the details of some of individual components are omitted for the sake of brevity.

The image sensor package 400 includes a substrate 402, an image sensor die 404 coupled to the substrate 402, and a transparent member 406 coupled to the image sensor die 404 such that an empty space 403 exists between an active area 408 of the image sensor die 404 and the transparent member 406. The substrate 402 includes a printed circuit board (PCB) substrate. In some examples, the substrate 402 includes a dielectric material. The substrate 402 includes a first surface 412 and a second surface 414 that is disposed opposite to the first surface 412. The substrate 402 may include electrical traces 461. The first surface 412 of the substrate 402 is disposed in a plane A4.

The image sensor package 400 may include one or more conductive components 420 coupled to the second surface 414 of the substrate 402. In some examples, the conductive components 420 are surface-mount packaging elements.

The image sensor die 404 may include a complementary metal-oxide semiconductor (CMOS) image sensor. The image sensor die 404 includes a first surface 416 and a second surface 418 disposed opposite to the first surface 416. The image sensor die 404 defines the active area 408 on the first surface 416 of the image sensor die 404. The active area 408 may have or correspond with, an array of pixel elements configured to convert electromagnetic radiation (e.g., light) to electrical signals.

The image sensor die 404 is coupled to the substrate 402. For example, the second surface 418 of the image sensor die 404 may be coupled to the first surface 412 of the substrate 402 using one or more bonding materials (e.g., an adhesive layer, die attach film, polymer-based material, an epoxy resin, etc.) in order to physically couple the image sensor die 404 to the substrate 402.

The transparent member 406 is coupled to the image sensor die 404 such that the transparent member 406 is positioned over (and spaced apart from) the active area 408 on the first surface 416 of the image sensor die 404 in the direction A1. The transparent member 406 includes a first surface 426 and a second surface 428 disposed opposite to the first surface 426. In some examples, the image sensor package 400 includes dam members 424 that position the transparent member 406 away from the active area 408 on the first surface 416 of the image sensor die 404. For example, the dam members 424 are coupled to the second surface 428 of the transparent member 406 and to the first surface 416 of the image sensor die 404, where the active area 408 on the first surface 416 of the image sensor die 404 is disposed between adjacent dam members 424. In some examples, the dam members 424 include an adhesive material. In some examples, the dam members 424 include an epoxy resin. In some examples, the dam members 424 include a polymer-based material.

The transparent member 406 includes an optically transparent material that allows electromagnetic radiation (e.g., light (e.g., visible light)) to pass through (e.g., pass through the entirety of the material). In some examples, the transparent member 406 includes a glass material. The image sensor package 400 includes an encapsulation material 430 configured to encapsulate one or more components of the image sensor package 400. The encapsulation material 430 may encapsulate the bond wires 422. The encapsulation material 430 may be disposed on the first surface 412 of the substrate 402 at locations adjacent to the image sensor die 404. The encapsulation material 430 may extend along an edge 432 of the image sensor die 404, the dam members 424, and/or an edge 434 of the transparent member 406.

The roughened areas 410 of the transparent member 406 are configured to reduce (or eliminate) flare. In some examples, the roughened areas 410 have a surface texture that is different than the other areas of the transparent member 406. In some examples, the roughened areas 410 are less smooth than other areas of the transparent member 406. In some examples, the roughened areas 410 include a surface having protrusions, detents, grooves, and/or ridges. In some examples, the roughened areas 410 are formed by sandblasting, laser, and/or chemical etching.

In some examples, the roughened areas 410 include a first roughened area 410-1 and a second roughened area 410-2. In some examples, the first roughened area 410-1 and the second roughened area 410-2 have the same surface texture. In some examples, the second roughened area 410-2 has a surface texture different than the surface texture of the first roughened area 410-1. The first roughened area 410-1 is defined on the first surface 426 proximate to the edge 434 on one side of the transparent member 406, and the second roughened area 410-2 is defined on the first surface 426 proximate to the edge 434 on the other side of the transparent member 406. The first surface 426 includes a smooth area 448 disposed between the first roughened area 410-1 and the second roughened area 410-2.

The first roughened area 410-1 has a first length (e.g., extending along the direction A2) that starts at the edge 434 of the transparent member 406 and extends along a portion of the first surface 426 of the transparent member 406 in a first direction. In some examples, the second roughened area 410-2 has a second length (e.g., extending along the direction A2) that starts at the other edge 434 of the transparent member 406 and extends along a portion of the first surface 426 of the transparent member 406 in a second direction (e.g., the second direction being opposite to the first direction). In some examples, the first length is the same as the second length. In some examples, the first length is different than the second length. In some examples, the smooth area 448 has a length (e.g., extending along the direction A2). In some examples, the length of the smooth area 448 is greater than a sum of the first length and the second length.

In some examples, the roughened areas 410 include a third roughened area 410-3 and a fourth roughened area 410-4 defined by the second surface 428 of the transparent member 406. The second surface 428 includes a smooth area 449 disposed between the third roughened area 410-3 and the fourth roughened area 410-4. Although FIG. 4 illustrates four roughened areas 410, the embodiment may encompass any number of roughened areas such as only two roughened areas 410 on the first surface 426, only two roughened areas 410 on the second surface 428, or any combination of roughened areas 410 on the first surface 426 and/or the second surface 428. In some examples, the surface textures of the third roughened area 410-3 and the fourth roughened area 410-4 are the same with respect to each other (and with respect to the first or second roughened area 410-1, 410-2), or different with respect to each other (and with respect to the first or second roughened area 410-1, 410-2).

The third roughened area 410-3 has a third length (e.g., extending along the direction A2) that starts at the inner edge of the dam member 424 and extends along a portion of the second surface 428 of the transparent member 406 in a first direction. In some examples, the third roughened area 410-4 has a fourth length (e.g., extending along the direction A2) that starts at the inner edge of the other dam member 424 and extends along a portion of the second surface 428 of the transparent member 406 in a second direction (e.g., the second direction being opposite to the first direction). In some examples, the third length is the same as the fourth length. In some examples, the third length is different than the fourth length. In some examples, the third length is shorter than the first length and/or the second length. In some examples, the fourth length is shorter than the first length and/or the second length. In some examples, the smooth area 449 has a length (e.g., extending along the direction A2). In some examples, the length of the smooth area 49 is greater than a sum of the third length and the fourth length.

Figure 5:
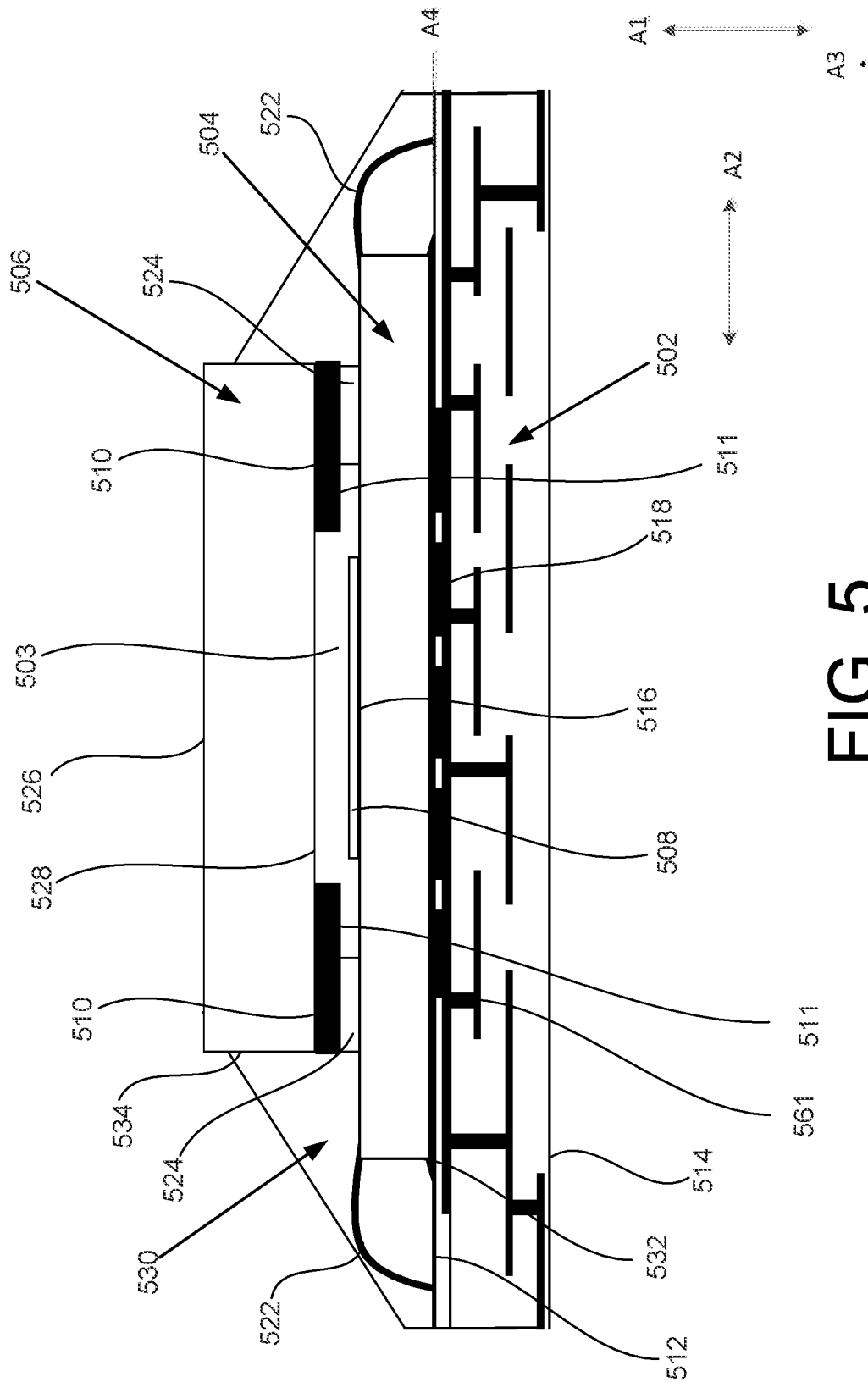

FIG. 5 illustrates an image sensor package 500 according to an aspect. The image sensor package 500 includes components similar to the image sensor package 200 of FIG. 2, the image sensor package 300 of FIG. 3, and/or the image sensor package 400 of FIG. 5 except that the image sensor package 500 includes an adhesive layer 510 that may reduce (or block) light that causes the flare within the image sensor package 500, thereby reducing the amount of noise introduced into the image captured by the image sensor die 504. The image sensor package 500 may include any of the features discussed with reference to the image sensor package 100 of FIGS. 1A and 1B, the image sensor package 200 of FIG. 2, the image sensor package 300 of FIG. 3, and/or the image sensor package 400 of FIG. 4, and therefore the details of some of individual components are omitted for the sake of brevity.

The image sensor package 500 includes a substrate 502, an image sensor die 504 coupled to the substrate 502, and a transparent member 506 coupled to the image sensor die 504 such that an empty space 503 exists between an active area 508 of the image sensor die 504 and the transparent member 506. The substrate 502 includes a printed circuit board (PCB) substrate. In some examples, the substrate 502 includes a dielectric material. The substrate 502 includes a first surface 512 and a second surface 514 that is disposed opposite to the first surface 512. In some examples, the substrate 502 includes electrical traces 561. The first surface 512 of the substrate 502 is disposed in a plane A4.

The image sensor die 504 may include a complementary metal-oxide semiconductor (CMOS) image sensor. The image sensor die 504 includes a first surface 516 and a second surface 518 disposed opposite to the first surface 516. The image sensor die 504 defines the active area 508 on the first surface 516 of the image sensor die 504. The active area 508 may have or correspond with, an array of pixel elements configured to convert electromagnetic radiation (e.g., light) to electrical signals.

The image sensor die 504 is coupled to the substrate 502. For example, the second surface 518 of the image sensor die 504 may be coupled to the first surface 512 of the substrate 502 using one or more bonding materials (e.g., an adhesive layer, die attach film, polymer-based material, an epoxy resin, etc.) in order to physically couple the image sensor die 504 to the substrate 502. In some examples, one or more bond wires 522 are connected to the image sensor die 504 and the substrate 502 in order to communicatively couple the image sensor die 504 to the substrate 502. The bond wires 522 may include conductive (e.g., metal) wires such as aluminum, copper, or gold, or any combination thereof, for example. In some examples, the image sensor die 504 is coupled to the substrate 502 in a flip-chip configuration. In some examples, the image sensor die 504 is coupled to the substrate 502 by surface mount technology (SMT) (e.g., interconnection by solder joint).

The transparent member 506 is coupled to the image sensor die 504 such that the transparent member 506 is positioned over (and spaced apart from) the active area 508 on the first surface 516 of the image sensor die 504 in the direction A1. The transparent member 506 includes a first surface 526 and a second surface 528 disposed opposite to the first surface 526.

The image sensor package 500 includes dam members 524 that position the transparent member 506 away from the active area 508 on the first surface 516 of the image sensor die 504. Each dam member 524 is coupled to the second surface 528 of the transparent member 506 via the adhesive layer 510, and to the first surface 516 of the image sensor die 504. In some examples, the dam member 524 includes a partially cured adhesive material, and the adhesive layer 510 includes a fully cured adhesive material. The adhesive layer 510 has a height extending between the second surface 528 and a particular dam member 524 (extending along the direction A1). The adhesive layer 510 has a length extending along the second surface 528 (e.g., along the direction A2). The length of the adhesive layer 510 may be greater than a length (extending along the direction A2) of the dam member 524. For example, the adhesive layer 510 includes a portion 511 that extends from an inner edge of a particular dam member 524, and the portion 511 may reduce or block light that may cause flare. The height of the adhesive layer 510 may be the same, greater, or less than the height of the dam member 524.

The transparent member 506 includes an optically transparent material that allows electromagnetic radiation (e.g., light (e.g., visible light)) to pass through (e.g., pass through the entirety of the material). In some examples, the transparent member 506 includes a glass material.

The image sensor package 500 includes an encapsulation material 530 configured to encapsulate one or more components of the image sensor package 500. The encapsulation material 530 may encapsulate the bond wires 522. The encapsulation material 530 may be disposed on the first surface 512 of the substrate 502 at locations adjacent to the image sensor die 504. The encapsulation material 530 may extend along an edge 532 of the image sensor die 504, an outer edge of the dam member 524, an outer edge of the adhesive layer 510, and/or an edge 534 of the transparent member 506.

Figure 6:
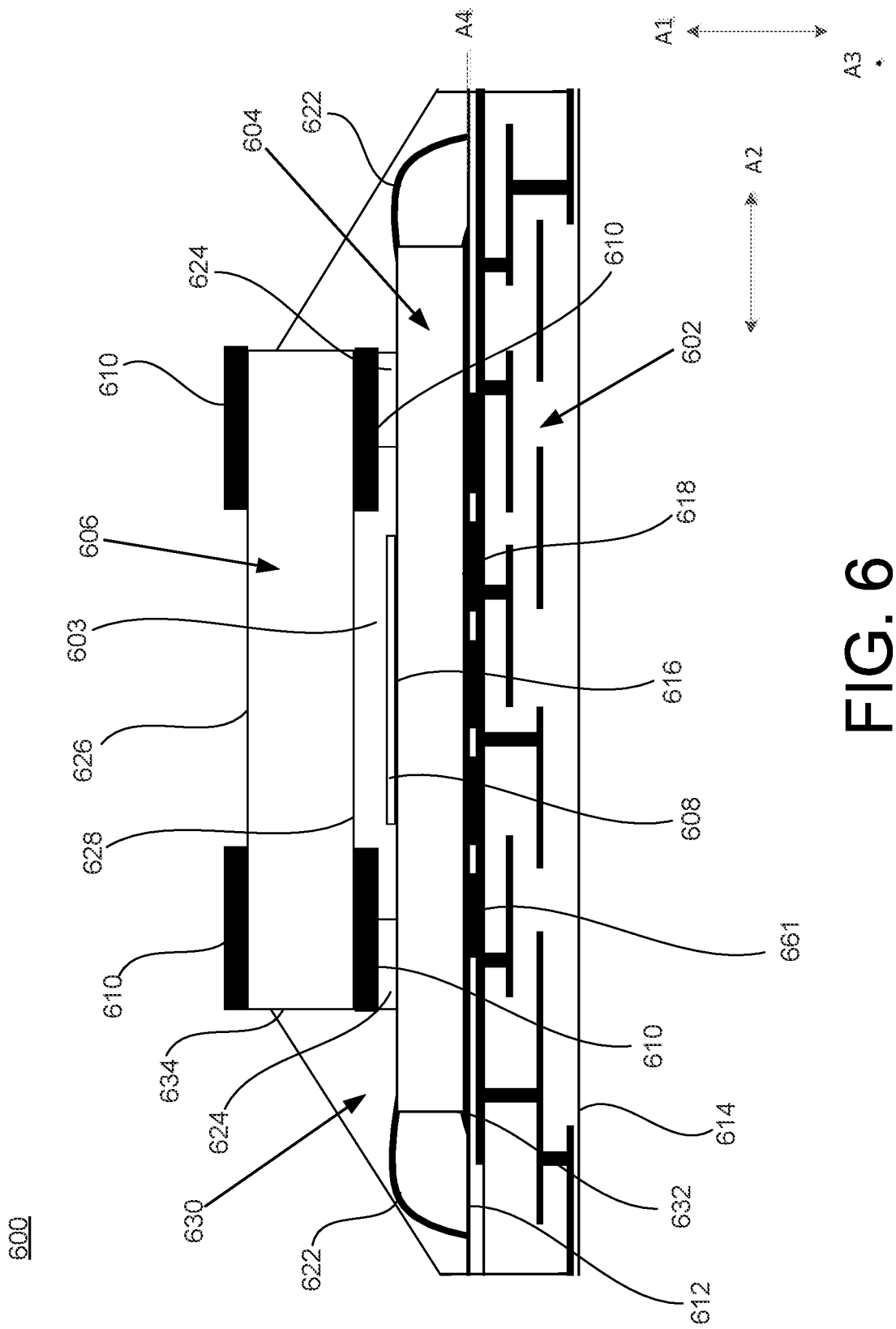

FIG. 6 illustrates an image sensor package 600 according to an aspect. The image sensor package 600 includes components similar to the image sensor package 500 of FIG. 5 except that the image sensor package 600 includes an adhesive layer 610 disposed on both surfaces of the transparent member 606. The image sensor package 600 may include any of the features discussed with reference to the image sensor package 500 of FIG. 5, and therefore the details of some of individual components are omitted for the sake of brevity.

The image sensor package 600 includes a substrate 602, an image sensor die 604 coupled to the substrate 602, and a transparent member 606 coupled to the image sensor die 604 such that an empty space 603 exists between an active area 608 of the image sensor die 604 and the transparent member 606. The substrate 602 includes a first surface 612 and a second surface 614 that is disposed opposite to the first surface 612. In some examples, the substrate 602 includes electrical traces 661. The first surface 612 of the substrate 602 is disposed in a plane A4.

The image sensor die 604 may include a complementary metal-oxide semiconductor (CMOS) image sensor. The image sensor die 604 includes a first surface 616 and a second surface 618 disposed opposite to the first surface 616. The image sensor die 604 defines the active area 608 on the first surface 616 of the image sensor die 604. The active area 608 may have or correspond with, an array of pixel elements configured to convert electromagnetic radiation (e.g., light) to electrical signals.

The image sensor die 604 is coupled to the substrate 602. For example, the second surface 618 of the image sensor die 604 may be coupled to the first surface 612 of the substrate 602 using one or more bonding materials (e.g., an adhesive layer, die attach film, polymer-based material, an epoxy resin, etc.) in order to physically couple the image sensor die 604 to the substrate 602. In some examples, one or more bond wires 622 are connected to the image sensor die 604 and the substrate 602 in order to communicatively couple the image sensor die 604 to the substrate 602.

The transparent member 606 is coupled to the image sensor die 604 such that the transparent member 606 is positioned over (and spaced apart from) the active area 608 on the first surface 616 of the image sensor die 604 in the direction A1. The transparent member 606 includes a first surface 626 and a second surface 628 disposed opposite to the first surface 626.

The image sensor package 600 includes dam members 624 that position the transparent member 606 away from the active area 608 on the first surface 616 of the image sensor die 604. In some examples, the dam members 624 include an adhesive material. In some examples, the dam members 624 include an epoxy resin. In some examples, the dam members 624 include a polymer-based material. The active area 608 on the first surface 616 of the image sensor die 604 is disposed between adjacent dam members 624.

Each dam member 624 is coupled to the second surface 628 of the transparent member 606 via the adhesive layer 610 on the second surface 628 of the transparent member 606, and to the first surface 616 of the image sensor die 604. Also, as shown in FIG. 6, an adhesive layer 610 is coupled to the first surface of the transparent member 606. In some examples, the dam member 624 includes a partially cured adhesive material, and the adhesive layer 610 includes a fully cured adhesive material.

The transparent member 606 includes an optically transparent material that allows electromagnetic radiation (e.g., light (e.g., visible light)) to pass through (e.g., pass through the entirety of the material). In some examples, the transparent member 606 includes an optically transparent material that allows the transmission of light waves without being scattered (or being scattered to a relatively small or negligible degree). In some examples, the transparent member 606 includes a glass material.

The image sensor package 600 includes an encapsulation material 630 configured to encapsulate one or more components of the image sensor package 600. The encapsulation material 630 may encapsulate the bond wires 622. The encapsulation material 630 may be disposed on the first surface 612 of the substrate 602 at locations adjacent to the image sensor die 604. The encapsulation material 630 may extend along an edge 632 of the image sensor die 604, an outer edge of the dam member 624, an outer edge of the adhesive layer 610, and/or an edge 634 of the transparent member 606.

Figure 7A:
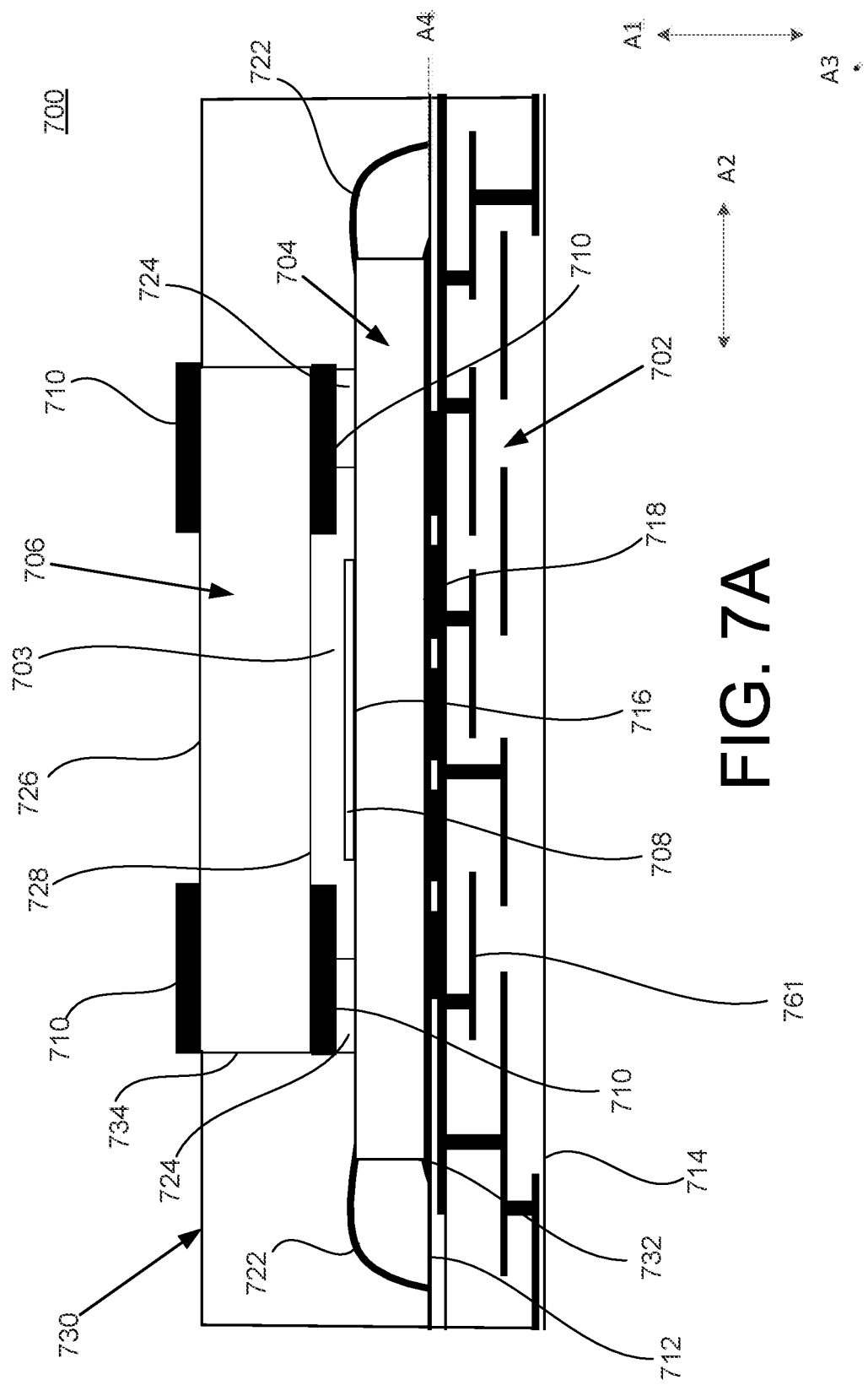
FIG. 7A illustrates another image sensor package according to aspect.
Figure 7B:
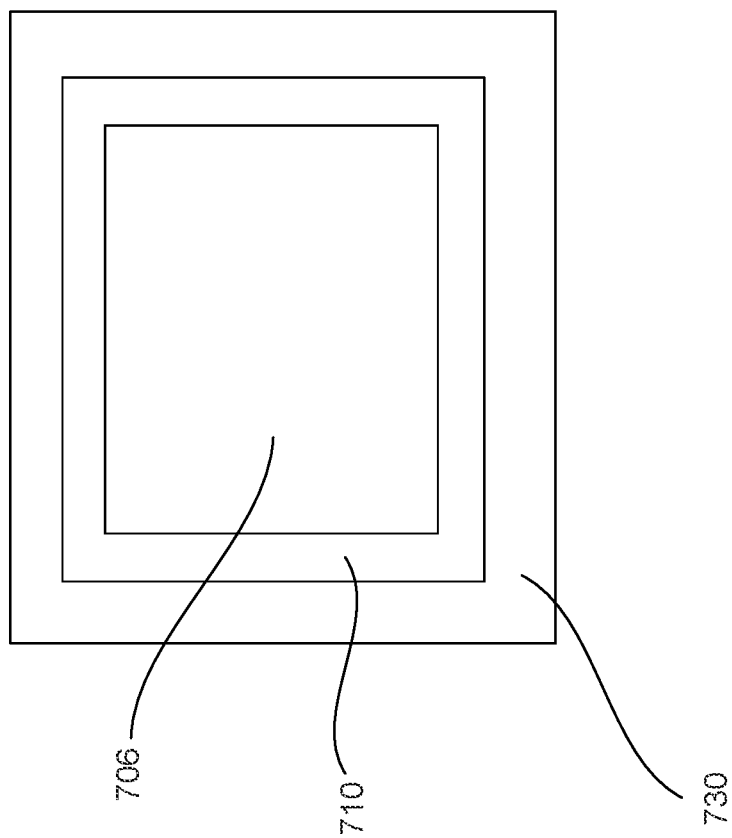
FIG. 7B illustrates a top view of the image sensor package according to an aspect.

FIG. 7A illustrates an image sensor package 700 according to an aspect, and FIG. 7B illustrates a top view of the image sensor package 700 according to an aspect. The top view of FIG. 7B may be applicable to any of the previously discussed image sensor packages. The image sensor package 700 includes components similar to the image sensor package 600 of FIG. 6 except that an encapsulation material 730 includes a molding material that is flat or planar with respect to a first surface 726 of the transparent material 706. Similar to FIG. 6, the image sensor package 700 includes an adhesive layer 710 disposed on both surfaces of the transparent member 706. The image sensor package 700 may include any of the features discussed with reference to the image sensor package 600 of FIG. 6, and therefore the details of some of individual components are omitted for the sake of brevity.

The image sensor package 700 includes a substrate 702, an image sensor die 704 coupled to the substrate 702, and a transparent member 706 coupled to the image sensor die 704 such that an empty space 703 exists between an active area 708 of the image sensor die 704 and the transparent member 706. The substrate 702 includes a first surface 712 and a second surface 714 that is disposed opposite to the first surface 712. In some examples, the substrate 702 includes electrical traces 761. The first surface 712 of the substrate 702 is disposed in a plane A4.

The image sensor die 704 may include a complementary metal-oxide semiconductor (CMOS) image sensor. The image sensor die 704 includes a first surface 716 and a second surface 718 disposed opposite to the first surface 716. The image sensor die 704 defines the active area 708 on the first surface 716 of the image sensor die 704. The active area 708 may have or correspond with, an array of pixel elements configured to convert electromagnetic radiation (e.g., light) to electrical signals.

The image sensor die 704 is coupled to the substrate 702. For example, the second surface 718 of the image sensor die 704 may be coupled to the first surface 712 of the substrate 702 using one or more bonding materials (e.g., an adhesive layer, die attach film, polymer-based material, an epoxy resin, etc.) in order to physically couple the image sensor die 704 to the substrate 702. In some examples, one or more bond wires 722 are connected to the image sensor die 704 and the substrate 702 in order to communicatively couple the image sensor die 704 to the substrate 702.

The transparent member 706 is coupled to the image sensor die 704 such that the transparent member 706 is positioned over (and spaced apart from) the active area 708 on the first surface 716 of the image sensor die 704 in the direction A1. The transparent member 706 includes a first surface 726 and a second surface 728 disposed opposite to the first surface 726.

The image sensor package 700 includes dam members 724 that position the transparent member 706 away from the active area 708 on the first surface 716 of the image sensor die 704. In some examples, the dam members 724 include an adhesive material. In some examples, the dam members 724 include an epoxy resin. In some examples, the dam members 724 include a polymer-based material. The active area 708 on the first surface 716 of the image sensor die 704 is disposed between adjacent dam members 724.

Each dam member 724 is coupled to the second surface 728 of the transparent member 706 via the adhesive layer 710 on the second surface 728 of the transparent member 706, and to the first surface 716 of the image sensor die 704. Also, as shown in FIG. 7, an adhesive layer 710 is coupled to the first surface of the transparent member 706. In some examples, the dam member 724 includes a partially cured adhesive material, and the adhesive layer 710 includes a fully cured adhesive material.

The transparent member 706 includes an optically transparent material that allows electromagnetic radiation (e.g., light (e.g., visible light)) to pass through (e.g., pass through the entirety of the material). In some examples, the transparent member 706 includes a glass material.

The image sensor package 700 includes an encapsulation material 730 configured to encapsulate one or more components of the image sensor package 700. The encapsulation material 730 includes a molding material. The encapsulation material 730 may encapsulate the bond wires 722. The encapsulation material 730 may be disposed on the first surface 712 of the substrate 702 at locations adjacent to the image sensor die 704. The encapsulation material 730 may extend along an edge 732 of the image sensor die 704, an outer edge of the dam member 724, an outer edge of the adhesive layer 710, and/or an edge 734 of the transparent member 706.

Figure 8:
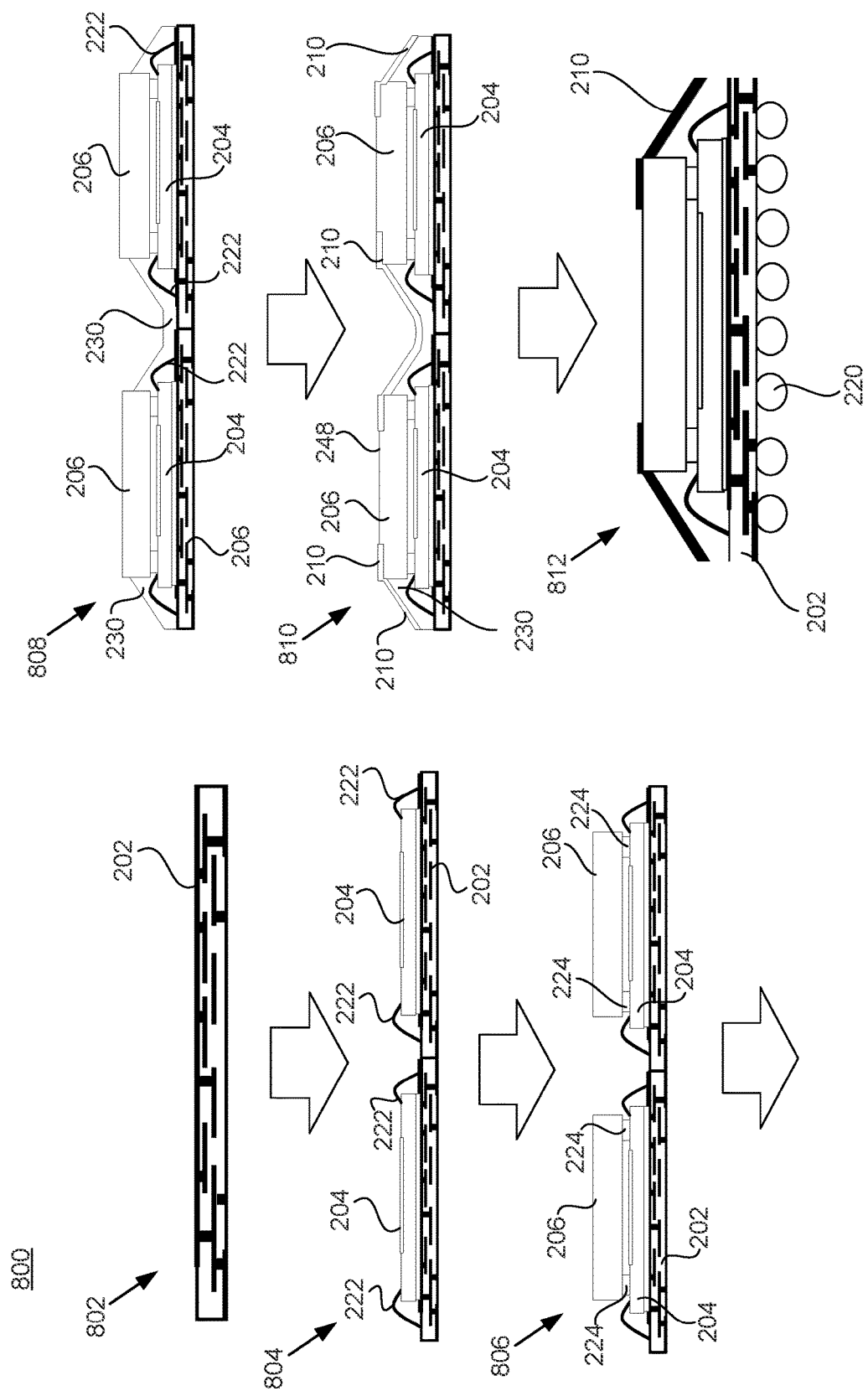
FIG. 8 illustrates a flowchart depicting example fabrication operations for an image sensor package according to an aspect.

FIG. 8 illustrates a flowchart 800 depicting example fabrication operations for manufacturing an image sensor package according to an aspect. Although the flowchart 800 is described with reference to the image sensor package 200 of FIG. 2, the flowchart 800 may be applicable to any of the sensor packaging structures discussed herein. Although the flowchart 800 of FIG. 8 illustrates operations in sequential order, it will be appreciated that this is merely an example, and that additional or alternative operations may be included. Further, operations of FIG. 8 and related operations may be executed in a different order than that shown, or in a parallel or overlapping fashion.

In operation 802, the substrate 202 is provided. In some examples, the substrate 202 has a strip format capable of supporting multiple units of CMOS image sensors to assembly on it with die bond and wire bond. In operation 804, the image sensor dice 204 are bonded of the substrate 202, and bond wires 222 are connected between the image sensor dice 204 and the substrate 202. In operation 806, a transparent member 206 is coupled to the top surface of each image sensor die 204 using the dam members 224. In some examples, the dam members 224 include an epoxy resin material, and the epoxy resin material is applied on the non-pixel area, and the epoxy resin material is curved by ultra-violet (UV) or thermal treatment. In operation 808, the encapsulation material 230 is applied to cover the bond wires 222 and to protect the exposed area of the image sensor die 204 and the exposed area of the transparent member 206.

In operation 810, the non-transparent layer 210 is coupled to the peripheral portions of the transparent member 206 and portions of the encapsulation material 230.

In some examples, in operation 810, the non-transparent layer 210 includes a polymer resin (or link) coated on the peripheral portions of the transparent member 206. The polymer resin is not transparent. In some examples, the non-transparent layer 210 includes electrical conductive filler inside such as Al, Ag, Cu, etc. (thereby making the non-transparent layer 210 anti-ESD). In some examples, the polymer resin (or ink) is UV curable or thermal curable. In some examples, the coating uses a temporary tape to attach on the pixel area (e.g., the portion 248) of the top surface of the transparent member 206 as a mask to keep off the resin. After printing the polymer resin, the tape is removed.

In some examples, in operation 810, the non-transparent layer 210 includes metal plating applied to the top surface of the transparent member 206 with a photo mask to determine the pattern. In some examples, the plating is performed on the transparent member 206 before any process treatment (e.g., incoming glass).

In operation 812, the conductive components 220 are coupled to the bottom surface of the substrate 202 (e.g., ball mount on the BGA pads on the bottom surface of the substrate 202).

Figure 9A:
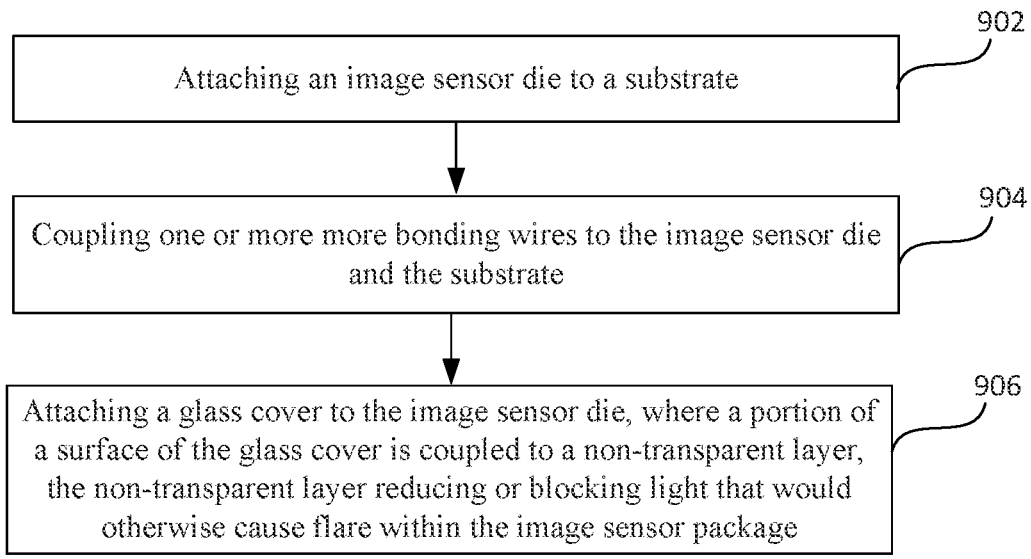
FIG. 9A illustrates a method for assembling an image sensor package according to an aspect.

FIG. 9A illustrates a flowchart 900 depicting example fabrication operations for manufacturing an image sensor package according to an aspect. The flowchart 900 may be applicable to any of the sensor packaging structures discussed herein. Although the flowchart 900 of FIG. 9A illustrates operations in sequential order, it will be appreciated that this is merely an example, and that additional or alternative operations may be included. Further, operations of FIG. 9A and related operations may be executed in a different order than that shown, or in a parallel or overlapping fashion.

In operation 902, an image sensor die is attached to a substrate. In operation 904, one or more bonding wires are coupled to the image sensor die and the substrate. In operation 906, a glass cover is attached to the image sensor die, where a portion of a surface of the glass cover is coupled to a non-transparent layer, and the non-transparent layer may reduce or block light that would otherwise cause flare within the image sensor package. In some examples, the glass cover is coated with the non-transparent layer before the glass cover is attached to the image sensor die. In some examples, the non-transparent layer is coated on a perimeter area (or a portion thereof) of a top surface of the glass cover. In some examples, the non-transparent layer is coated on a perimeter area (or a portion thereof) of a bottom surface of the glass cover. In some examples, the non-transparent layer is coated on both the top and bottom surfaces of the transparent member. In some examples, the method further includes applying an encapsulation material (e.g., a molding) to the substrate such that the one or more bonding wires are encapsulated in the encapsulation material.

Figure 9B:
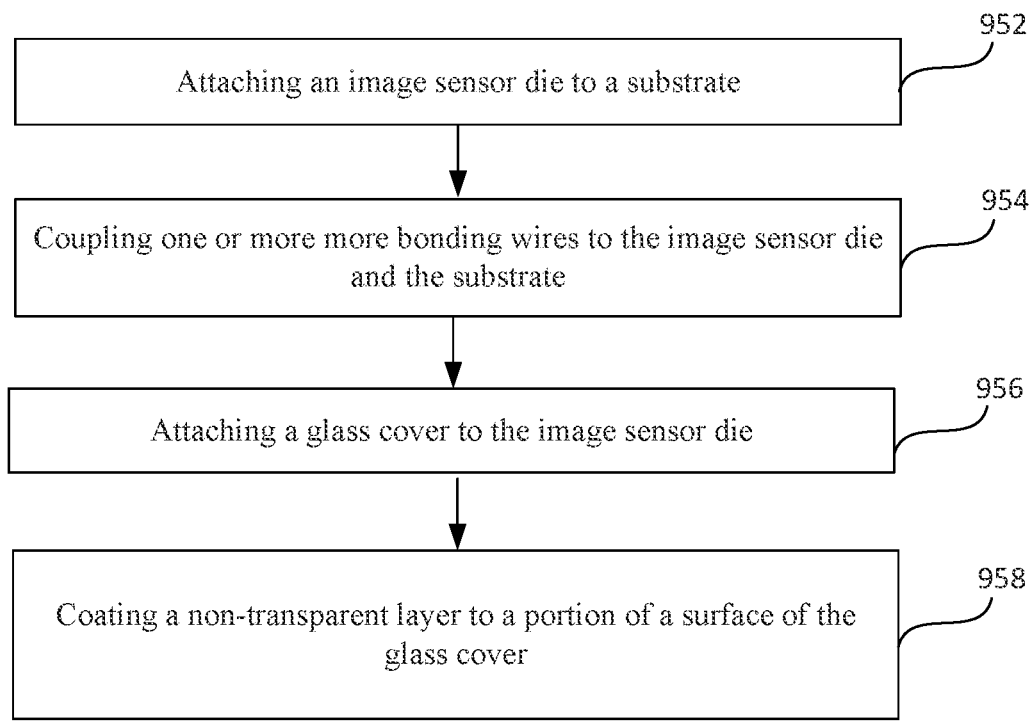
FIG. 9B illustrates a method for assembling an image sensor package according to another aspect.

FIG. 9B illustrates a flowchart 950 depicting example fabrication operations for manufacturing an image sensor package according to an aspect. The flowchart 950 may be applicable to any of the sensor packaging structures discussed herein. Although the flowchart 950 of FIG. 9B illustrates operations in sequential order, it will be appreciated that this is merely an example, and that additional or alternative operations may be included. Further, operations of FIG. 9B and related operations may be executed in a different order than that shown, or in a parallel or overlapping fashion.

In operation 952, an image sensor die is attached to a substrate. In operation 954, one or more bonding wires are coupled to the image sensor die and the substrate. In operation 956, a glass cover is attached to the image sensor die. In operation 958, a non-transparent layer is coated to a portion of a surface of the glass cover, and the non-transparent layer may reduce or block light that would otherwise cause flare within the image sensor package. In some examples, the glass cover is coated with the non-transparent layer after the glass cover is attached to the image sensor die. In some examples, the non-transparent layer is coated on a perimeter area (or a portion thereof) of a top surface of the glass cover. In some examples, the non-transparent layer is coated on a perimeter area (or a portion thereof) of a bottom surface of the glass cover. In some examples, the non-transparent layer is coated on both the top and bottom surfaces of the transparent member. In some examples, the method further includes applying an encapsulation material (e.g., a molding) to the substrate such that the one or more bonding wires are encapsulated in the encapsulation material.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or subcombinations of the functions, components and/or features of the different embodiments described.

The invention claimed is:

1. A sensor package comprising:
a substrate including an image sensor die, the image sensor die having an active area configured to receive an incoming optical signal;
a transparent layer including a first surface and a second surface, the first surface positioned at an edge of the sensor package and the second surface facing the image sensor die;
at least one dam member that couples a first portion of the second surface of the transparent layer to the image sensor die; and
a light blocking layer that contacts a second portion of the second surface of the transparent layer and that surrounds the active area of the image sensor die, the second portion being adjacent to the first portion, the light blocking layer not contacting the first portion.

2. The sensor package of claim 1, wherein the light blocking layer includes a non-transparent material configured to coat a portion of the transparent layer.

3. The sensor package of claim 1, wherein the light blocking layer covers a perimeter of the second surface of the transparent layer.

4. The sensor package of claim 1, wherein the light blocking layer includes a polymer resin with an electrically conductive material.

5. The sensor package of claim 1, wherein the at least one dam member is non-transparent.

6. The sensor package of claim 1, further comprising encapsulation material that extends along edges of the image sensor die and the transparent layer.

7. The sensor package of claim 6, further comprising:
at least one bond wire connected to the substrate and the image sensor die, wherein the encapsulation material encapsulates the at least one bond wire.

8. A sensor package comprising:
a substrate including an image sensor die, the image sensor die having an active area configured to receive an incoming optical signal;
a transparent layer including a first surface and a second surface, the first surface positioned at an edge of the sensor package and the second surface facing the image sensor die;
a light blocking layer that contacts the second surface of the transparent layer and that surrounds the active area of the image sensor die; and
an encapsulation material that extends along edges of the image sensor die and the transparent layer,
wherein the encapsulation material defines a shape that decreases in height from the edge of the transparent layer to an edge of the sensor package.

9. A method of manufacturing a sensor package comprising:
bonding image sensor dice to a substrate configured to support multiple units of sensors;
connecting bond wires between the image sensor dice and the substrate;
coupling a light blocking layer along a perimeter of a surface of a transparent member;
coupling the transparent member over a given image sensor die of the bonded image sensor dice using at least one dam member, the transparent member being coupled with the surface having the light blocking layer facing the given image sensor die; and
applying encapsulation material to cover the bond wires and encapsulate edges of each image sensor die and corresponding transparent member, including, shaping the encapsulation material to decrease in height from an edge of the transparent member to an edge of the sensor package.

10. The method of claim 9, wherein the coupling the light blocking layer along the perimeter of a surface of a transparent member includes curing a resin material on the surface of the transparent member using ultra-violet treatment.

11. The method of claim 10, wherein the coupling the light blocking layer along the perimeter of a surface of a transparent member also includes:
applying a tape on a central portion of the surface;
applying the resin material on the surface of the transparent member after applying the tape; and
removing the tape after applying the resin material.

12. The method of claim 9, wherein the coupling the light blocking layer along the perimeter of a surface of a transparent member includes applying a metal plating to the surface of the transparent member using a photo mask.

13. The method of claim 9, wherein the at least one dam member includes a resin material, wherein the method further comprises curing the resin material using ultra-violet treatment.

14. A sensor package comprising:
a substrate including an image sensor die;
a transparent layer including a first surface and a second surface, the first surface positioned at an edge of the sensor package and the second surface facing the image sensor die;
at least one dam member coupling a first portion of the second surface of the transparent layer to the image sensor die; and
a light blocking layer contacting only a second portion of the second surface of the transparent layer, the second portion being adjacent to the first portion.

15. The sensor package of claim 14, wherein the light blocking layer includes a non-transparent material configured to coat a portion of the transparent layer.

16. The sensor package of claim 14, wherein the light blocking layer covers a perimeter of the second surface of the transparent layer.

17. The sensor package of claim 14, wherein the light blocking layer includes a polymer resin with an electrically conductive material.

18. The sensor package of claim 14, further comprising:
an encapsulation material extending along an edge of the image sensor die and an edge of the transparent layer; and
at least one bond wire connected to the substrate and the image sensor die, wherein the encapsulation material encapsulates the at least one bond wire.

19. The sensor package of claim 18, wherein the encapsulation material defines a shape that decreases in height from the edge of the transparent layer to an edge of the sensor package.

* * * * *